(12) United States Patent  (10) Patent No.: US 8,748,885 B2
Yeh et al.  (45) Date of Patent: Jun. 10, 2014

(54) SOFT MATERIAL WAFER BONDING AND METHOD OF BONDING

(75) Inventors: Tung-Ti Yeh, Tainan (TW); Chung-Yi Huang, New Taipei (TW); Ya Wen Wu, Kaohsiung (TW); Hui Mei Jao, Tainan (TW); Ting-Chun Wang, Tainan (TW); Shiu-Ko JangJian, Tainan (TW); Chia-Hung Chung, Shanhua Township (TW)

(73) Assignee: Taiwan Semiconductor Manufacturing Company, Ltd. (TW)

(*) Notice: Subject to any disclaimer, the term of this patent is extended or adjusted under 35 U.S.C. 154(b) by 103 days.

(21) Appl. No.: 13/371,198

(22) Filed: Feb. 10, 2012

(65) Prior Publication Data

US 2013/0207098 A1 Aug. 15, 2013

(51) Int. Cl.
 *H01L 29/12* (2006.01)
(52) U.S. Cl.
 USPC ............. 257/43; 257/625; 257/676; 257/779; 257/784
(58) Field of Classification Search
 USPC .................. 257/618–628, E21.122–E21.128, 257/E21.567–E21.57
 See application file for complete search history.

(56) References Cited

U.S. PATENT DOCUMENTS

| | | | |
|---|---|---|---|
| 5,324,980 A * | 6/1994 | Kusunoki | 257/74 |
| 6,864,585 B2 | 3/2005 | Enquist | |
| 7,037,755 B2 * | 5/2006 | Enquist | 438/109 |
| 7,325,572 B2 | 2/2008 | Schinazi et al. | |
| 7,387,944 B2 | 6/2008 | Tong et al. | |
| 7,553,744 B2 | 6/2009 | Tong et al. | |
| 7,807,549 B2 | 10/2010 | Tong et al. | |
| 7,867,807 B2 * | 1/2011 | Kishita et al. | 438/64 |
| 2003/0119279 A1 * | 6/2003 | Enquist | 438/455 |
| 2012/0077329 A1 * | 3/2012 | Broekaart et al. | 438/455 |
| 2012/0251747 A1 * | 10/2012 | Chang et al. | 428/34.6 |
| 2013/0119548 A1 * | 5/2013 | Avouris et al. | 257/762 |

OTHER PUBLICATIONS

Gosele, U., et al, "Fundamental Issue in Wafer Bonding", J. Vac. Sci. Technol. A 17(4), Jul./Aug. 1999, pp. 1145-1152.
Suni, T., "Effects of Plasma Activation on Hydrophilic Bonding of Si and SiO2", Journal of the Electromechanical Society, 149, (6) G348-G351 (2002), pp. G348-G351.

* cited by examiner

*Primary Examiner* — Julio J Maldonado
*Assistant Examiner* — Jaehwan Oh
(74) *Attorney, Agent, or Firm* — Lowe Hauptman & Ham, LLP

(57) ABSTRACT

A semiconductor device including a first wafer assembly having a first substrate and a first oxide layer over the first substrate. The semiconductor device further includes a second wafer assembly having a second substrate and a second oxide layer over the second substrate. The first oxide layer and the second oxide layer are bonded together by van der Waals bonds or covalent bonds. A method of bonding a first wafer assembly and a second wafer assembly including forming a first oxide layer over a first substrate. The method further includes forming a second oxide layer over a second wafer assembly. The method further includes forming van der Waals bonds or covalent bonds between the first oxide layer and the second oxide layer.

20 Claims, 4 Drawing Sheets

SOFT MATERIAL WAFER BONDING AND METHOD OF BONDING

BACKGROUND

The forming of complex semiconductor devices often involves attaching two wafers together. In some designs the use of an adhesive or epoxy adversely impacts the performance of the product. In such design, wafer bonding is often used to attach wafers together.

Wafer bonding occurs when two wafer surfaces with sufficiently small total thickness variations are brought together at room temperature. The surfaces of the wafers are subjected to a plasma or chemical treatment to increase the density of bonding sites on the wafer surfaces. Van der Waals bonds are formed between the two surfaces, which can be annealed to form stronger covalent bonds.

Hydrophilic bonding occurs in an aqueous environment between oxide layers formed on the wafer surfaces. A plasma treatment creates holes for bonding with hydroxide ions separated from water molecules and hydroxide ions from opposite wafer surfaces form van der Waals bonds. Hydrophobic bonding occurs in an environment with little or no water directly between wafers. A plasma treatment creates free electrons for bonding with hydrogen ions to form van der Waals bonds.

These techniques for wafer bonding require exerting a large magnitude of force onto the wafers during the bonding process to prevent the wafers from becoming misaligned. In an arrangement with a backside illumination sensor, poor alignment can result in offset of a color filter in the backside illumination sensor, thereby altering the colors of the detected image. The large force in turn distorts the surface of the wafer. In an arrangement with a backside illumination sensor, wafer surface distortion reduces the image resolution of the sensor.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features. Specific examples of components and arrangements are described below to simplify the present disclosure. These are of course, merely examples and are not intended to be limiting.

Figure 1:
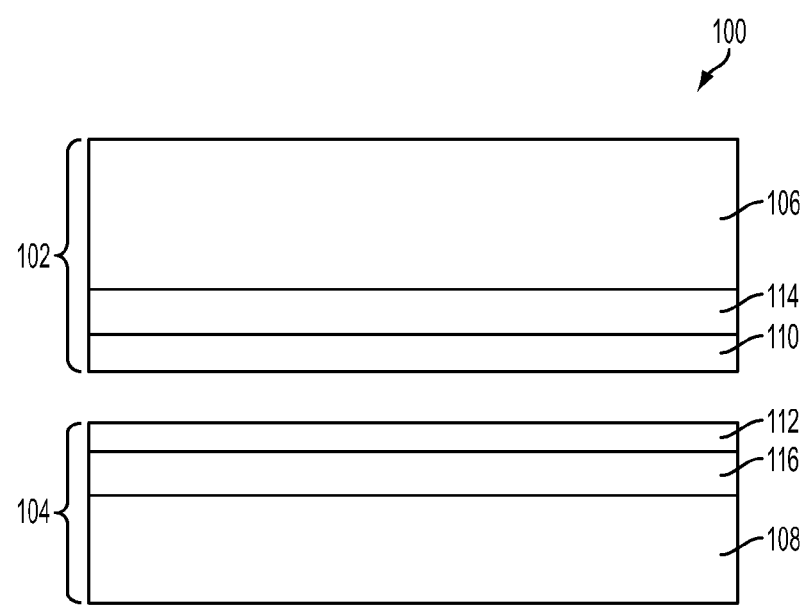
FIG. 1 is a side view diagram of an arrangement of two wafer assemblies prior to bonding according to one or more embodiments.

FIG. 1 is a side view diagram of an arrangement 100 including two wafer assemblies 102 and 104 prior to bonding. Wafer assembly 102 includes a substrate 106 having an oxide layer 110 over a surface of the substrate 106 between the two wafer assemblies 102 and 104. A soft material layer 114 is between substrate 106 and oxide layer 110. Wafer assembly 104 is arranged in a similar manner with a substrate 108, an oxide layer 112 and a soft material layer 116. In some embodiments, only one or neither of wafer assembly 102 and 104 includes a soft material layer.

Substrate 106 and 108 are silicon. In some embodiments, substrates 106 and 108 are germanium, gallium arsenide, sapphire, or other suitable semiconductor material.

Oxide layers 110 and 112 are silicon oxide. In some embodiments, oxide layers 110 and 112 are aluminum oxide, copper oxide, titanium oxide, zinc oxide, germanium oxide or other suitable material. Oxide layers 110 and 112 have a thickness ranging from 1 nanometers (nm) to 1,000 nm.

Soft material layers 114 and 116 are aluminum. In some embodiments, soft material layers 114 and 116 are copper, tin, germanium, indium, gold, titanium or other suitable soft materials. A soft material is a material having a Young's modulus less than that of silicon. This range, in some embodiments, is narrower, e.g., less than 180 GPa. Young's modulus is a measure of the stiffness of an elastic material. A material with a high Young's Modulus value, such as a ceramic, will not easily deform when a force is exerted on the material. A material with a low Young's Modulus value, such as rubber, will easily deform when a force is exerted on the material. Soft material layers 114 and 116 have low Young's Modulus values permitting the layers to absorb the force of the bonding process to prevent distortion of the wafer assemblies 102 or 104. The force absorption effect permits the exertion of higher forces on the wafer assemblies 102 and 104 during the bonding process, thereby reducing the risk of misalignment of the wafer assemblies. Soft material layers 114 and 116 have a thickness ranging from 1 nm to 10,000 nm.

FIGS. 2A-2D are a side view of a wafer bonding apparatus 200 at various stages of the bonding process. Wafer bonding apparatus 200 includes a first wafer assembly 202, similar to wafer assembly 102, retained by central vacuum ports 205a and peripheral vacuum ports 205b in contact with a top support 204. In some embodiments, vacuum ports 205a and 205b are disposed in top support 204 at various positions along the interface between the first wafer assembly 202 and the top support 204. Wafer bonding apparatus 200 further includes a second wafer assembly 206 attached to a bottom support 208 by a plurality of vacuum ports 209 disposed at various positions along the second wafer assembly 206/bottom support 208 interface. Top support 204 has an opening 212 to allow a push pin 210 to pass through top support 204 and contact first wafer assembly 202. Push pin 210 is configured to exert a force on first wafer assembly 202 to press the first wafer assembly onto second wafer assembly 206 to facilitate formation of van der Waals bonds between the wafer assemblies 202 and 206. In some embodiments, push pin 210 is omitted and first wafer assembly 202 and second wafer assembly 206 are pressed together by top support 204 and bottom support 208 to facilitate formation of van der Waals bonds between the wafer assemblies 202 and 206.

In some embodiments, push pin 210 is a cylindrical object with a substantially flat surface configured to contact first wafer assembly 202. In some embodiments, push pin 210 has a rectangular shape or other suitable shape. Push pin 210 comprises a material strong enough to withstand the forces exerted on first wafer assembly 202 without fracturing. Push pin 210 is configured not to scratch a surface of first wafer assembly 202. In some embodiments, push pin 210 comprises metal, plastic, polymer or other suitable composition.

In some embodiments, wafer bonding apparatus 200 is situated in an aqueous environment for hydrophilic wafer bonding. In other embodiments, wafer bonding apparatus 200 is situated in a substantially water free environment for hydrophobic wafer bonding.

First wafer assembly 202 and second wafer assembly 206 are similar to the wafer assemblies 102 and 104 (FIG. 1). In some embodiments, first wafer assembly 202 and second wafer assembly 206 both have soft material layers. In other embodiments, only one of first wafer assembly 202 and second wafer assembly 206 have a soft material layer. In still other embodiments, neither first wafer assembly 202 nor second wafer assembly 206 have a soft material layer.

Figure 2A:
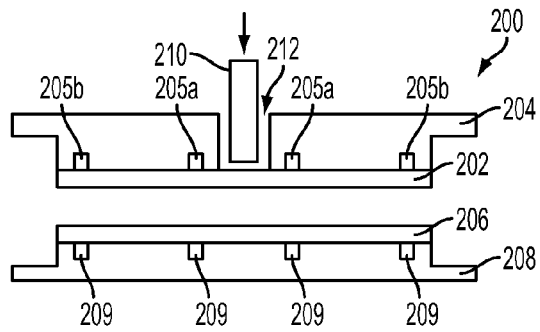
FIGS. 2A-2D are side view diagrams of a wafer bonding apparatus at various stages of the bonding process.
Figure 2B:
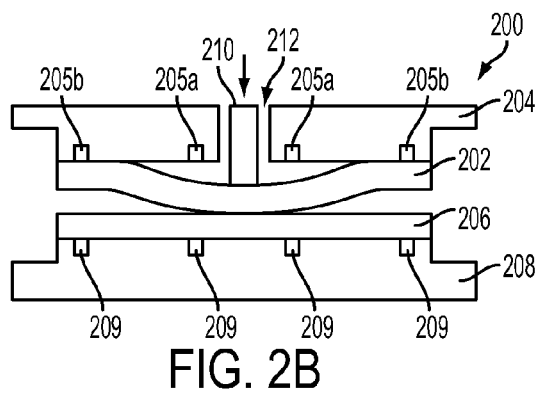

Prior to the bonding process, first wafer assembly 202 and second wafer assembly 206 are attached to top support 204 and bottom support 208, respectively, by activating vacuum ports 205a, 205b and 209, as shown in FIG. 2A. When the bonding process begins, central vacuum ports 205a are deactivated and push pin 210 exerts a downward force on first wafer assembly 202, as shown in FIG. 2B. The force exerted by push pin 210 ranges from 1,000 milliNewtons (mN) to 100,000 mN.

Figure 2C:
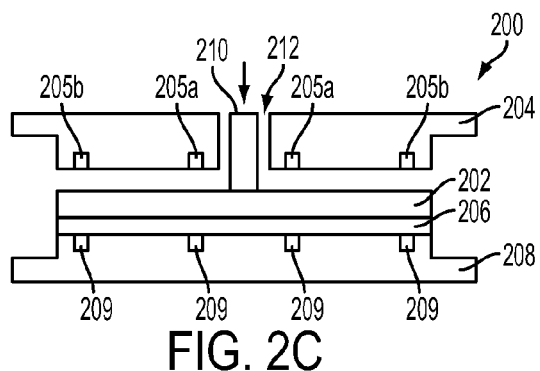
Figure 2D:
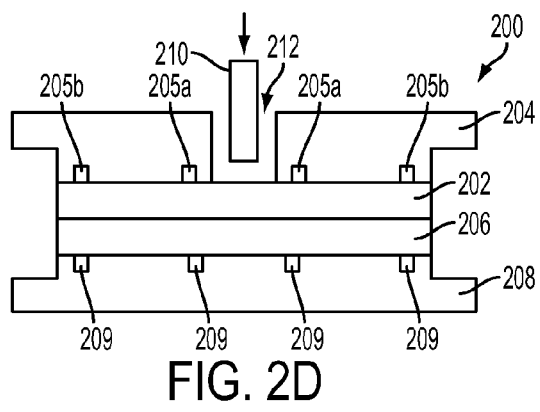

Following contact between central portions of first wafer assembly 202 and second wafer assembly 206, peripheral vacuum ports 205b are deactivated and the mechanical strength of first wafer assembly 202 pulls the peripheral portions of the first wafer assembly into contact with the second wafer assembly 206, as shown in FIG. 2C. Top support 204 is then moved downward to exert force across the surface of first wafer assembly 202 to facilitate the forming of van der Waals bonds along the entire first wafer assembly 202/second wafer assembly 206 interface, as shown in FIG. 2D. The force exerted by top support 204 ranges from 1,000 mN to 100,000 mN. In some embodiments, bottom support 208 is raised to exert force on the first and second wafer assemblies 202 and 206. In other embodiments, both top support 204 and bottom support 208 are configured to move to exert force on first and second wafer assemblies 202 and 206.

Figure 4:
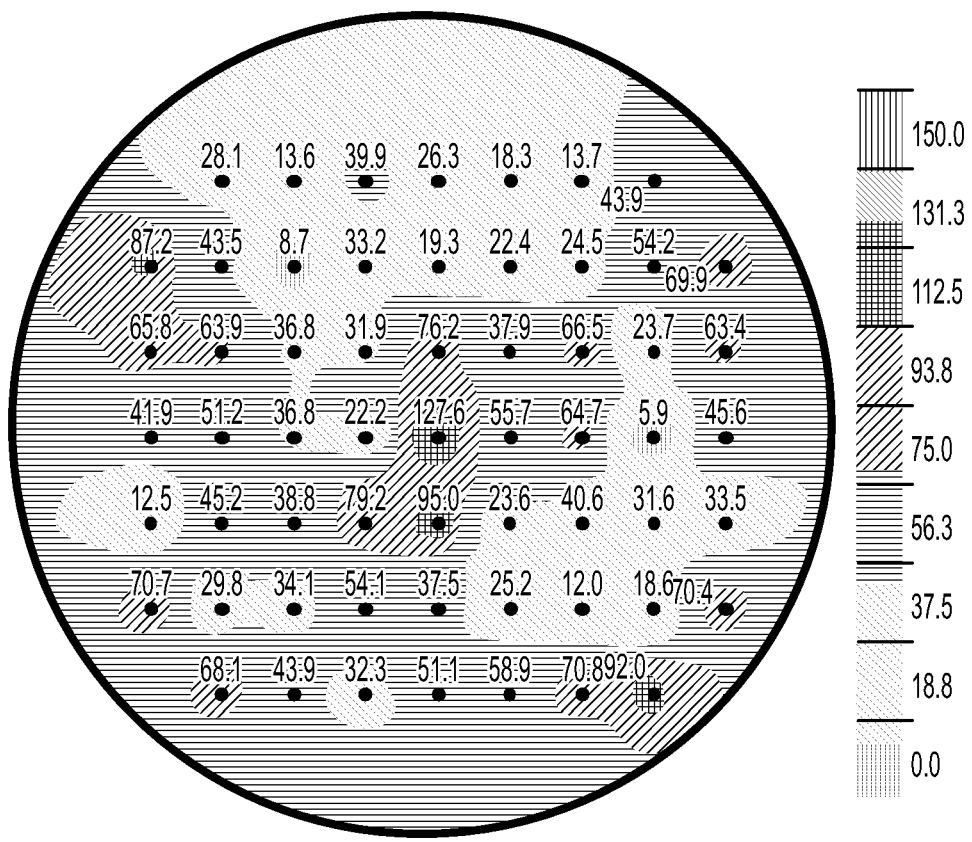
FIG. 4 is a chart of distortions across a surface of a semiconductor device formed by wafer bonding according to one or more embodiments.

For a device, such as a camera or a backside illumination sensor, to perform in an acceptable manner, the distortion must be less than 70 nm. In some embodiments, distortion is measured using a lithography tool. Distortion of a wafer assembly occurs as a result of localized or uneven force exerted on the wafer assembly. In the embodiments of FIGS. 2A-2D, the potential for distortion is greatest at the location where push pin 210 contacts first wafer assembly 202 and where the peripheral portions of first wafer assembly 202 are released from vacuum ports 205b to contact second wafer assembly 206. It was found, by placing oxide layers on both first and second wafer assemblies 202 and 206 the percentage of devices with acceptable distortion levels increased to above 84.7% versus 71.9% for devices with an oxide layer on only one of the first wafer assembly or the second wafer assembly. FIG. 4 shows a chart 400 of distortion measurements at various points across a surface of a semiconductor device. The distortion measurements of chart 400 show 86.5% of the device of the semiconductor device have distortions below the 70 nm threshold. In a device including soft material layers in first and second wafer assemblies 202 and 206, the percentage of devices with acceptable distortion increases to 100%.

Figure 3:
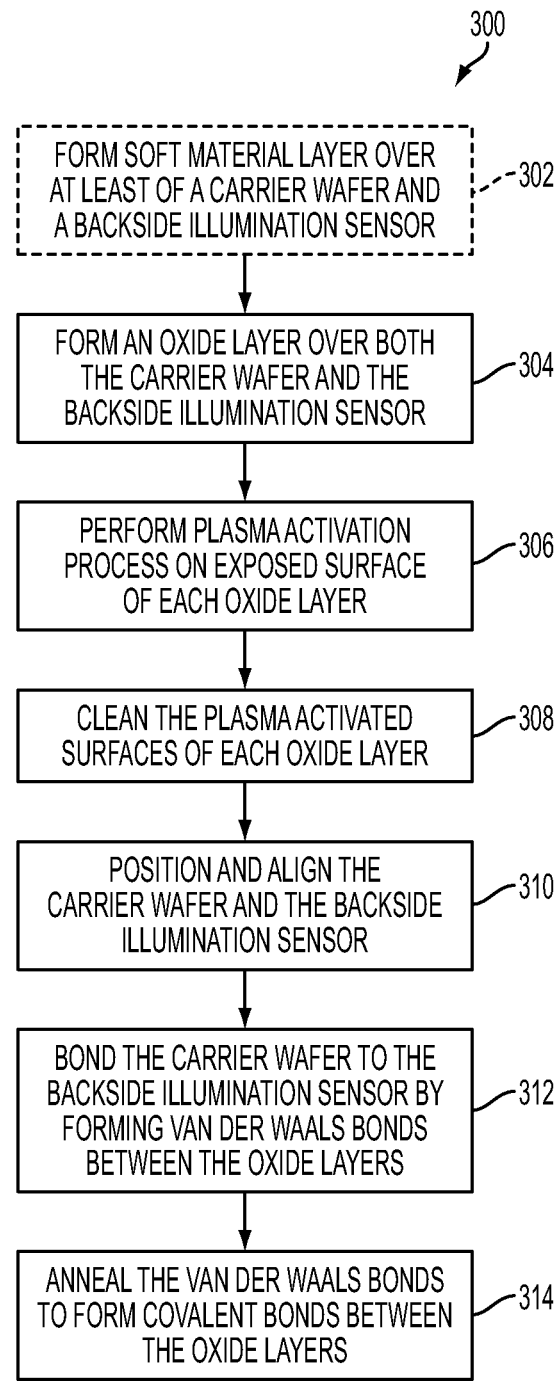
FIG. 3 is a flow chart of a method of forming a semiconductor device by wafer bonding according to one or more embodiments.

FIG. 3 is a flowchart of a method 300 of forming a semiconductor device by wafer bonding. In optional step 302, a soft material layer is formed over at least one of a carrier wafer and a device wafer. In some embodiments, the device wafer is part of a backside illumination sensor. The soft material layer is formed using physical vapor deposition (PVD). In some embodiments, the soft material layer is formed using chemical vapor deposition (CVD), high density plasma CVD (HDP CVD), epitaxial growth, or other suitable deposition processes.

Method 300 continues with step 304 in which an oxide layer is formed over both the carrier wafer and the device wafer. The oxide layer is formed using HDP CVD. In some embodiments, the oxide layer is formed using PVD, CVD, epitaxial growth, or other suitable deposition methods. In some embodiments, the oxide layer is formed using the same process as the soft material layer, if used. In other embodiments, the oxide layer is formed using a different process than the soft material layer, if used.

In step 306, an exposed surface of the oxide layer is subjected to a plasma activation process to increase bonding site density in the oxide layer. The plasma activation process includes placing the wafer assembly in a chamber at a pressure ranging from 500 mTorr to 10,000 mTorr and contacting the surface with argon, oxygen and/or nitrogen plasma.

Method 300 continues with step 308 in which the plasma activated surfaces of the oxide layers are cleaned. The wafer assemblies are cleaned with deionized water. In some embodiments, the wafer assemblies are cleaned with an aqueous solution of ammonia or other suitable cleaning solutions.

In step 310, the carrier wafer and the device wafer are positioned in a bonding arrangement and aligned. As mentioned above, proper alignment is necessary for a device to function properly. For example, in a backside illumination sensor, misalignment can result in alteration of the color of the detected image.

In step 312, the carrier wafer and the device wafer are bonded together by forming van der Waals bonds between the oxide layers. In some embodiments, the bonding process is to the same as the bonding process shown in FIGS. 2A-2D used to form van der Waals bonds between the wafer assemblies. In some embodiments, the bonding process is similar to the bonding process shown in FIGS. 2A-2D used to form van der Waals bonds between the wafer assemblies.

Method 300 concludes with step 314 in which the van der Waals bonds formed during step 312 are annealed to form covalent bonds between the oxide layers. The annealing process heats the wafer assemblies to a temperature ranging from 150° C. to 1,000° C. The covalent bonds formed during the annealing process securely bond the two wafer assemblies together. In an embodiment where the oxide layer is silicon dioxide, the covalent bonds formed are Si—O—Si covalent bonds.

One aspect of the description relates to a semiconductor device including a first wafer assembling including a first substrate and a first oxide layer; a second wafer assembly including a second substrate and a second oxide layer, where the first wafer assembly is bonded to the second wafer assembly by a plurality of covalent bonds.

Another aspect of the description relates to a method of bonding a first wafer assembly to a second wafer assembly by depositing oxide layers on each of the first and second wafer assemblies, aligning the first and second wafer assemblies and exerting a force on at least one of the first wafer assembly or second wafer assembly to form van der Waals bonds between the first and second wafer assemblies.

Still another aspect of the description relates to a method of forming a semiconductor device including depositing a first oxide layer over a light incident surface of the semiconductor device, depositing a second oxide layer over a carrier wafer, and forming covalent bonds between the first oxide layer and the second oxide layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor structure comprising:
   a first substrate having a first oxide layer over the first substrate;
   a second substrate having a second oxide layer over the second substrate; and
   a first soft material layer disposed between the first substrate and the first oxide layer;
   wherein the first oxide layer is directly bonded to the second oxide,
   wherein the first soft material layer is selected from the group consisting of aluminum, copper, tin, germanium, indium, gold and titanium.

2. The semiconductor structure of claim 1, further comprising: a second soft material layer disposed between the second substrate and the second oxide.

3. The semiconductor structure of claim 1, wherein a plurality of semiconductor devices are respectively disposed in the first substrate.

4. The semiconductor structure of claim 1, wherein a plurality of semiconductor devices are respectively disposed in the second substrate.

5. The semiconductor structure of claim 1, wherein the first oxide layer and the second oxide layer is silicon oxide or aluminum oxide.

6. The semiconductor structure of claim 2, wherein the second soft material layer is selected from the group consisting of aluminum, copper, tin, germanium, indium, gold and titanium.

7. The semiconductor device of claim 1, wherein the soft material layer has a Young's modulus of less than 180 GPa.

8. The semiconductor device of claim 1, wherein the first soft material layer has a thickness ranging from 100 nm to 600 nm.

9. The semiconductor device of claim 1, wherein the second soft material layer has a thickness ranging from 100 nm to 600 nm.

10. The semiconductor device of claim 1, wherein the first oxide layer and the second oxide layer independently have thicknesses ranging from 100 nm to 600 nm.

11. The semiconductor device of claim 1, wherein the first substrate is a carrier wafer, and the second substrate is a solid state image device.

12. The semiconductor device of claim 1, wherein the second substrate is a carrier wafer, and the first substrate is a solid state image device.

13. The semiconductor device of claim 1, wherein the first oxide layer and the second oxide layer independently have thickness ranging from 1 nm to 1,000 nm.

14. A semiconductor structure comprising:
    a first substrate having a first oxide layer over the first substrate;
    a second substrate having a second oxide layer over the second substrate;
    a first soft material layer disposed between the first substrate and the first oxide layer; and
    a second soft material layer disposed between the second substrate and the second oxide layer;
    wherein the first oxide layer is directly bonded to the second oxide,
    wherein the first soft material layer is selected from the group consisting of aluminum, copper, tin, germanium, indium, gold and titanium.

15. The semiconductor structure of claim 14, wherein a plurality of semiconductor devices are respectively disposed in the first substrate.

16. The semiconductor structure of claim 14, wherein the first oxide layer and the second oxide layer is selected from the group consisting of silicon oxide and aluminum oxide.

17. The semiconductor device of claim 14, wherein the first and the second soft material layer has a Young's modulus of less than 180 GPa.

18. The semiconductor device of claim 14, wherein the first and the second soft material layer has a thickness ranging from 100 nm to 600 nm.

19. The semiconductor device of claim 14, wherein the first substrate is a carrier wafer, and the second substrate is a solid state image device.

20. The semiconductor device of claim 14, wherein the first oxide layer and the second oxide layer independently have thickness ranging from 1 nm to 1,000 nm.

* * * * *